(12) United States Patent
Flasck

(10) Patent No.: US 6,266,037 B1
(45) Date of Patent: Jul. 24, 2001

(54) WAFER BASED ACTIVE MATRIX

(75) Inventor: Richard A. Flasck, San Ramon, CA (US)

(73) Assignee: RAF Electronics, San Ramon, CA (US)

( * ) Notice: Subject to any disclaimer, the term of this patent is extended or adjusted under 35 U.S.C. 154(b) by 0 days.

(21) Appl. No.: 08/324,540

(22) Filed: Oct. 18, 1994

Related U.S. Application Data

(63) Continuation of application No. 08/023,475, filed on Feb. 25, 1993, now abandoned, which is a continuation of application No. 07/392,859, filed on Aug. 11, 1989, now abandoned.

(51) Int. Cl.$^7$ .................................................. G09G 3/36
(52) U.S. Cl. .......................... 345/92; 345/93; 345/206; 349/42; 349/140
(58) Field of Search .................... 345/87, 92, 93, 345/103, 205, 206; 359/53, 54, 57, 70; 349/5, 42, 73, 74, 10, 86, 88, 140

(56) References Cited

U.S. PATENT DOCUMENTS

| | | | |
|---|---|---|---|
| 3,525,566 | 8/1970 | Altman | 353/66 |
| 3,807,831 | * 4/1974 | Soref | 350/333 |
| 3,824,003 | 7/1974 | Koda et al. | 350/160 |
| 4,239,346 | * 12/1980 | Lloyd | 345/87 |
| 4,368,963 | 1/1983 | Stolov | 353/31 |
| 4,470,060 | * 9/1984 | Yamazaki | 350/333 |
| 4,519,678 | * 5/1985 | Komatsubara et al. | 359/70 |
| 4,547,042 | 10/1985 | Ngo | 350/334 |
| 4,574,282 | 3/1986 | Crossland et al. | 340/784 |
| 4,582,395 | * 4/1986 | Morozumi | 350/334 |
| 4,688,900 | * 8/1987 | Doane et al. | 359/52 |
| 4,716,403 | 12/1987 | Morozumi | 340/702 |
| 4,745,454 | * 5/1988 | Erb | 357/14 |
| 4,749,259 | 6/1988 | Ledubuhr | 350/337 |

(List continued on next page.)

FOREIGN PATENT DOCUMENTS

| | | | |
|---|---|---|---|
| WO88/10545 | 12/1988 | (DE) . | |
| 0034409 | 1/1981 | (EP) | G02F/1/133 |
| 0198168 | 2/1986 | (EP) | G02F/1/133 |
| 0294899 | 6/1988 | (EP) | G02F/1/137 |
| 0 364 043 | 4/1990 | (EP) . | |

OTHER PUBLICATIONS

Proceedings of the Society for Information Display, vol. 18/2 Second Quarter 1977; A.G. Dewey, "Projection Systems for Light Valves," pp. 134–146.

*Liquid Crystal Chemistry, Physics, and Applications* (1989) "High Resolution Displays Using NCAP Liquid Crystals", vol. 1080, pp. 169–173, Macknick, A. Brian, Jones, Phil and White, Larry.

Primary Examiner—Dennis-Doon Chow
(74) Attorney, Agent, or Firm—Morris, Manning & Martin, L.L.P.

(57) ABSTRACT

A wafer based active matrix reflective light encoding system formed on a conventional wafer including a specular reflective back surface and an LC or similar characteristic material formed thereon which is electronically altered to impart or encode information onto a light beam which is directed to and reflected therefrom. The LC material preferably is a solid light modulating material having bodies of LC material suspended in the solid material. The matrix transistors can be any conventional type of crystalline based structure, such as NMOS, CMOS, or PMOS and can be coupled to the bit and/or word lines by fuses to prevent shorts associated with a single pixel from shorting a whole line. The pixel capacitor can include a junction or oxide type capacitor or a combination thereof. The matrix bit and/or word lines can include strapping to prevent open lines. The wafer based active matrix can be mated to a light directing and projecting structure to form a reflective image plane module which projects the reflected beam for viewing or imaging, such as through one or more lens to form a part of a projection system.

26 Claims, 15 Drawing Sheets

U.S. PATENT DOCUMENTS

| | | | |
|---|---|---|---|
| 4,804,953 | * | 2/1989 | Castleberry .......................... 350/333 |
| 4,818,074 | | 4/1989 | Yokoi et al. ......................... 350/338 |
| 4,826,311 | | 5/1989 | Ledebuhr ............................... 353/31 |
| 4,838,654 | | 6/1989 | Hamaguchi et al. ................ 350/333 |
| 4,839,707 | | 6/1989 | Shields ............................... 357/23.7 |
| 4,908,692 | * | 3/1990 | Kikuchi et al. ....................... 357/51 |
| 4,936,656 | * | 6/1990 | Yamashita et al. ................. 350/333 |
| 4,944,576 | * | 7/1990 | Lacker et al. ....................... 350/334 |
| 4,995,703 | * | 2/1991 | Noguchi ................................. 359/59 |
| 5,022,750 | * | 6/1991 | Flasck .................................... 359/41 |
| 5,024,524 | * | 6/1991 | Flasck .................................... 359/41 |
| 5,028,121 | | 7/1991 | Bauer et al. ..................... 350/331 R |

* cited by examiner

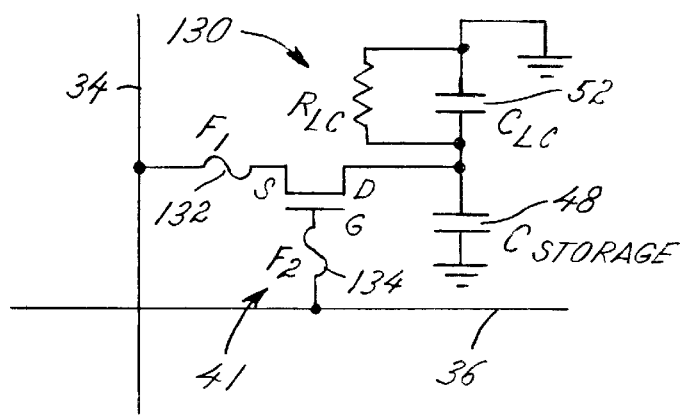
FIG. 13
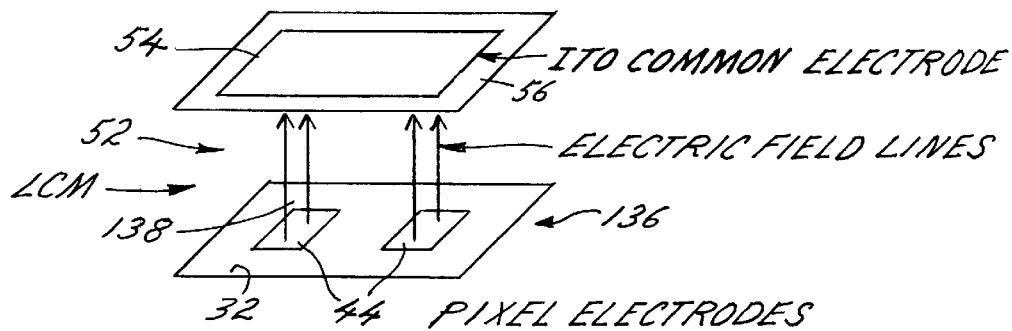
FIG. 14
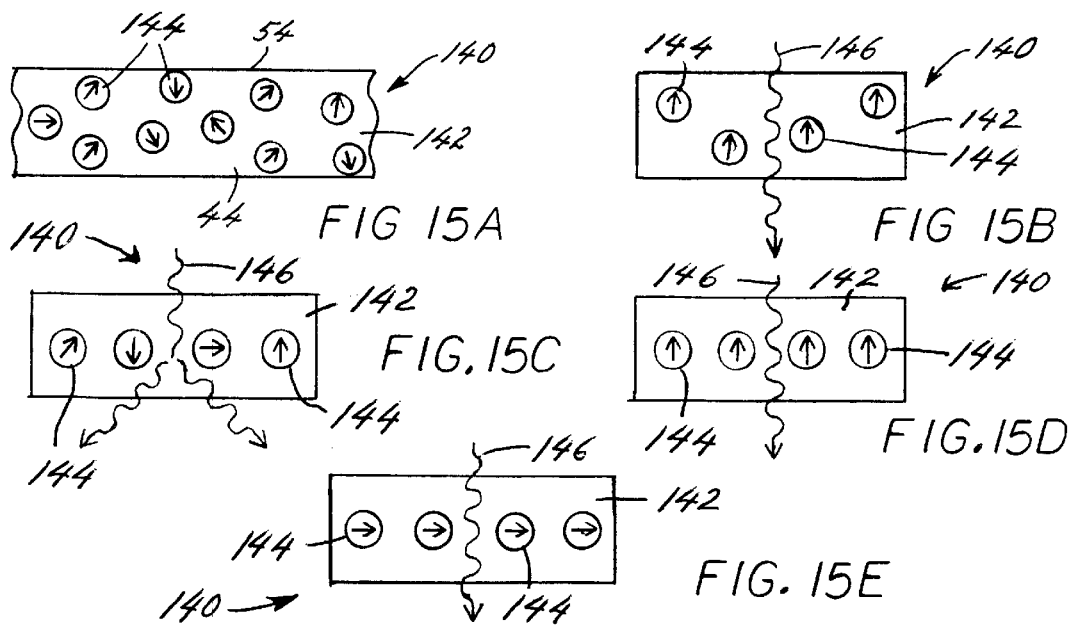
FIG 15A
FIG 15B
FIG. 15C
FIG. 15D
FIG. 15E

O = VIAS OR OXIDE CUTS
▨ = ALUMINUM BIT LINE STRAP

▨ DIF. BIT LINES

▨ POLYWORD LINES

WAFER BASED ACTIVE MATRIX

This application is a continuation of application Ser. No. 08/023,475, filed Feb. 25, 1993, which is a continuation of application Ser. No. 07/392,859, filed Aug. 11, 1989 now abandoned.

BACKGROUND OF THE INVENTION

The invention relates generally to light encoding systems and more particularly to a wafer based active matrix reflective light encoding system.

During the last two decades, there have been numerous efforts to develop and commercialize light encoding systems such as flat panel displays to effectively compete with the conventional cathode ray tube (CRT) or to develop products which are not possible utilizing CRT's. Of these efforts, plasma display panels (PDP), electroluminescent displays (EL) and several types of liquid crystal displays (LCD) have clearly been the most successful and have exhibited the most dynamic growth and future potential. One specific type of display, active matrix liquid crystal displays (AMLCD), has demonstrated sufficient performance to address some major market segments.

The cost of AMLCD's is largely determined by the yield of useable devices, where the yield is the percentage of useable devices from the total produced. Yield of AMLCD's is in large part determined by the device design, manufacturing process tolerance and the display size. In general, the larger the display size, the lower the yield and hence higher the cost of the device.

The focus of efforts in recent years has been in developing direct view display sizes large enough to replace existing TV and computer monitors. Pocket TV's have been introduced having one to three inch wide display screens, with the expressed goal of producing larger displays as volume and yield increase. An intense effort is being made to produce a fourteen inch diagonal or larger display. The ultimate goal of some efforts is to produce wall size direct view displays for the TV market. This goal is very likely to be frustrated by the inherent obstacles in producing a CRT or any other type of direct view display of that size.

The AMLCD effort has concentrated on utilizing a matrix of nonlinear devices on a glass or fused silica substrate. The nonlinear devices allow individual control over each display picture element or "pixel" to provide superior optimal performance. The nonlinear devices generally are amorphous or polycrystalline silicon thin film transistors (TFT); however, thin film diodes (TFD) and metal-insulator-metal (MIM) devices also have been employed.

A transparent substrate is considered necessary for these displays, because most liquid crystal (LC) materials require a polarizer at both the front and the back of the LCD device. Further, the conventional position on color displays is that they must be transmissive rather than reflective, because of the light losses inherent in the color reflective mode.

In developing larger size displays, substrate cost becomes important. Amorphous silicon TFT AMLCD's utilize inexpensive drawn glass. Polycrystalline silicon on the other hand, requires either very high temperature glass or fused silica substrates. Either of these substrates is prohibitively expensive in widths over eight inches. The inexpensive amorphous silicon AMLCD substrates are offset by the fact that these displays require separate address devices which result in several hundred interconnections to the display substrate. Polycrystalline silicon AMLCD's allow integration of the addressing circuitry on the substrate which reduces the number of interconnections to a very few.

The first direct view AMLCD utilizing a single crystal silicon wafer was produced in the early 1970's. Work on this development continued into the early 1980's, utilizing standard crystal silicon wafers and wafer fabrication techniques. This work appears to virtually have been abandoned since the display sizes are limited to less than the available wafer size and because the wafers are not transparent. These devices utilized dynamic scattering guest-host or dyed phase change rather than conventional twisted nematic LC material, which required expensive and elaborate photolithography to produce the required diffuse reflective aluminum back surface. These devices do provide fast, high performance and stable displays with integrated address and drive circuitry.

New markets have been recognized which include home theatre high definition TV, audio visual machines and high resolution large area computer aided design (CAD) stations. Each of these markets require very large, high resolution, full color and video speed imaging. In reviewing these markets Applicant has determined that the large area dictates projection systems, either front or rear projection, that the high resolution requires integrated drivers and that projection systems do not require either transparent substrates or large display sizes. Further, these markets all essentially utilize what can be considered light encoding devices. Other types of light encoding devices include wafer or printed circuit board mask sets.

It, therefore, would be desirable to provide a wafer based active matrix reflective light encoding system having high resolution, integrated drivers and manufactured with conventional wafer fabrication techniques.

SUMMARY OF INVENTION

The disadvantages of the prior art light encoding systems and techniques are overcome in accordance with the present invention by providing a wafer based active matrix reflective light encoding system utilizing a conventional wafer.

A source of light is directed to the wafer based active matrix which imparts or encodes information onto a light beam reflected therefrom. The wafer based active matrix includes a specular reflective back surface and an LC or similar characteristic material formed thereon which is electronically altered to impart or encode the information to the light beam reflected therefrom. The LC material preferably is a solid light modulating material having bodies of LC material suspended in the solid material.

The matrix transistors can be any conventional type of crystalline based structure, such as NMOS, CMOS or PMOS. The pixel capacitor can be a junction or oxide type capacitor or a combination thereof. The matrix bit and/or word lines can include strapping to prevent open lines. The transistors can be coupled to the bit and/or word lines by fuses to prevent shorts associated with a single pixel from shorting a whole line.

The wafer based active matrix can be mated to a light directing and projecting structure to form a reflective image plane module. The reflective image plane module light projecting structure projects the reflected beam for viewing or imaging, such as through one or more lens. The reflective image plane module light directing and projecting structure is formed from a prism or mirror which passes the light or light component through a first surface to the wafer based active matrix mated to a second surface and which projects the reflected light from the first surface to be viewed or imaged.

BRIEF DESCRIPTION OF THE DRAWINGS

FIG. 13 is a schematic diagram of a fuse protected pixel embodiment of the present invention;

FIG. 14 is a diagrammatic perspective view illustrating the activation of a conventional LCD structure;

FIGS. 15A, 15B, 15C, 15D and 15E are schematic cross sections of polymer dispersed LC material illustrating the operation thereof;

DESCRIPTION OF THE PREFERRED EMBODIMENTS

One major utilization of light encoding devices is light encoding projector systems. The wafer based active matrix light encoding system of the present invention is not limited to utilization in such systems; however, projector systems will be described for example purposes.

Figure 1:
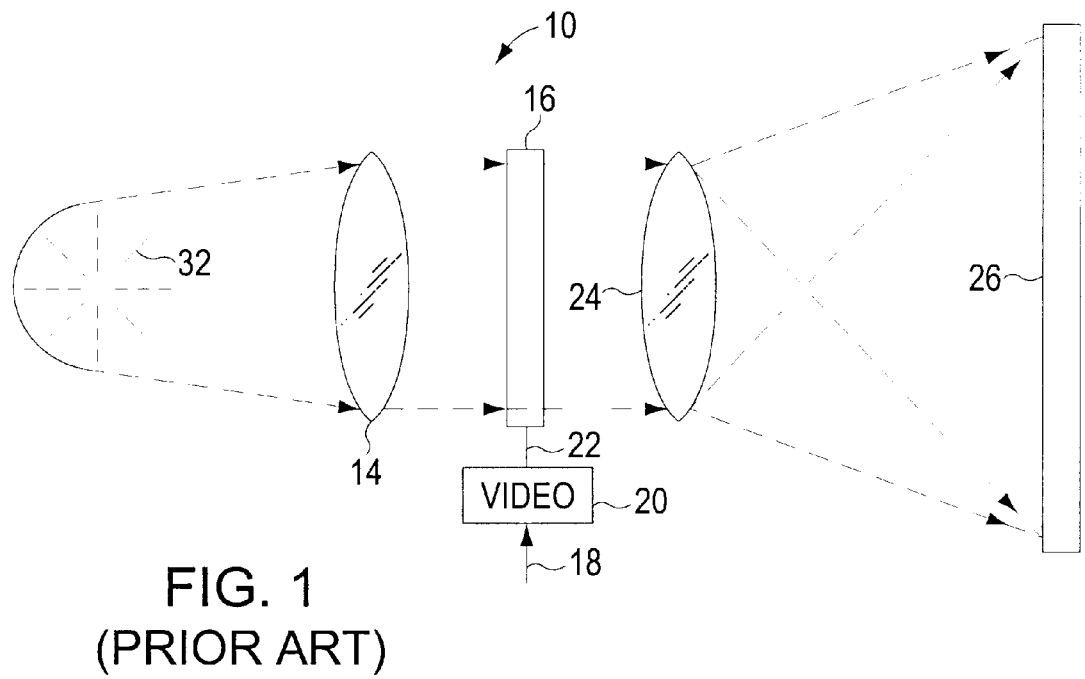
FIG. 1 is a diagrammatic view of a prior art light encoding transmissive projector system.

Referring to FIG. 1, a prior light art light encoding transmissive projection system 10 is illustrated. A light source 12 provides light to a lens or lens system 14, which directs the light to a transmissive LCD 16. A video or computer signal source (not illustrated) is coupled by a line 18 to a video drive circuit 20. The video drive circuit 20 operates on the signal coupled thereto and generates the required drive signals coupled over a line 22 to the LCD 16. Typically the drive signals will be the audio, red video, blue video, green video, vertical sync, horizontal sync, reset and pixel clock signals. The drive signals cause the pixels of the LCD 16 to block or transmit light to impart or encode the required information onto the light transmitted through the LCD 16 to a lens or lens system 24 which projects the composite color picture onto a screen 26. A monochrome projection system would operate in the same manner with only one video light component, rather than the separate blue, green and red video signals.

One prior art transmissive projection system has been developed by Seiko Epson Corp. and utilizes three separate LCD panels, one for each of the blue, green and red video signals. The signals then are combined by a dichroic prism prior to projecting onto the screen. These transmissive projection systems suffer from a number of problems. One significant problem is caused by the construction required by the LC material. The LCD panels include a polarizer on each side of the LC material, such as twisted nematic material, and are utilized as a shutter to absorb the light not to be transmitted. Both the polarizers and the LC material absorb light which generates heat, which is deleterious to the LCD panel. Further, because of the two polarizers, and the LC material utilized, only about fifteen per cent or less of the light directed to the LCD panel is transmitted therethrough for projection to the screen. The devices exhibit low brightness, because of the amount of light absorbed.

Further, the resolution of the transmissive panels, typically based upon amorphous silicon deposited active matrix devices, is not as great as that which could be achieved if crystalline based technology was utilized. The pixel density can be made greater by placing the pixel drain pads centered over row and column lines in crystalline devices. Amorphous silicon devices have to leave spaces between pixels for the row and column lines and hence cannot be packed as densely without severely decreasing the yield.

As mentioned above, deposited amorphous silicon devices have a much greater number of LCD panel interconnects. This decreases reliability and increases cost. These devices are also designed as large area devices which again decreases yield and increases costs.

If polysilicon is utilized to decrease the number of interconnects, other problems occur since the polysilicon transistors are leaky. Therefore, typically these LCD devices utilize two transistors in series at each pixel, which again decreases reliability and increases costs.

Figure 2:
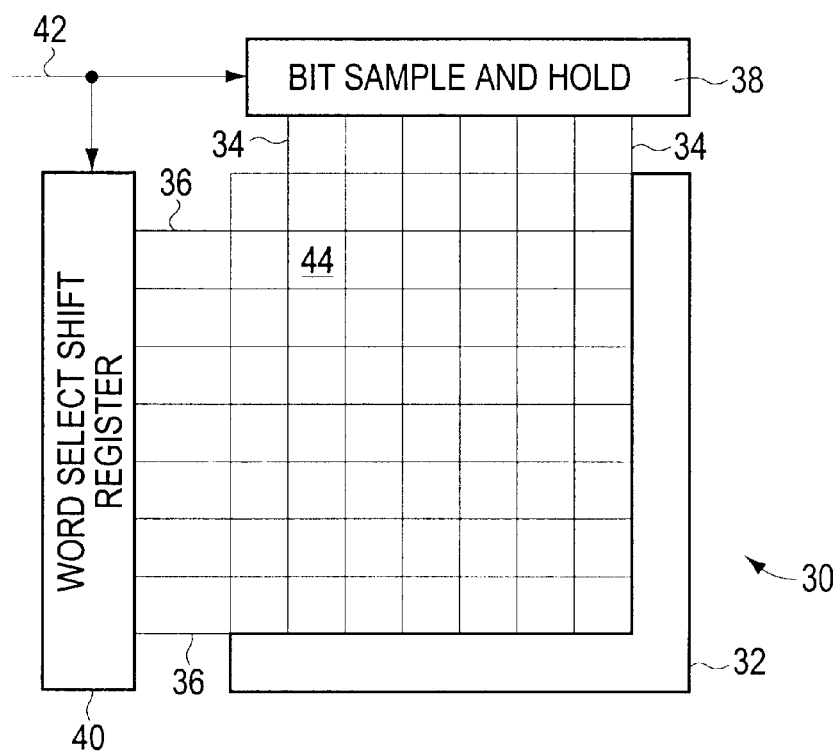
FIG. 2 is a schematic block diagram of a wafer based active matrix embodiment of the present present invention.

Referring to FIG. 2, a block diagram of a wafer based active matrix embodiment of the present invention is designated generally by the reference numeral 30. The wafer based active matrix 30 preferably is formed on a conventional silicon wafer, which forms a substrate 32 for the wafer based active matrix 30. Typically, the substrate 32 will be only a segment of a wafer, as a plurality of the wafer based active matrices 30 will be formed at the same time on a wafer.

The wafer based active matrix 30 includes a plurality of bit or column lines 34 formed into a matrix intersecting a plurality of word or row lines 36. The bit lines 34 are coupled to a conventional bit sample and hold circuit 38, which preferably also is formed onto the wafer segment 32 as a part of the wafer based active matrix 30. The word lines 36 are coupled to a conventional word select shift register 40, also preferably formed on the wafer segment 32.

An analog or digital data signal will be fed to the circuits 38 and 40 on an input line 42. The data signal is derived from a standard signal source, such as NTSC or HDTV television or computer graphic signals. The standard signal is fed to a video interface board where the signal is decomposed into seven parallel signals: audio, red analog video, green analog video, blue analog video, vertical sync, horizontal sync, reset and the pixel clock which then are fed to the line 42.

Figure 3:
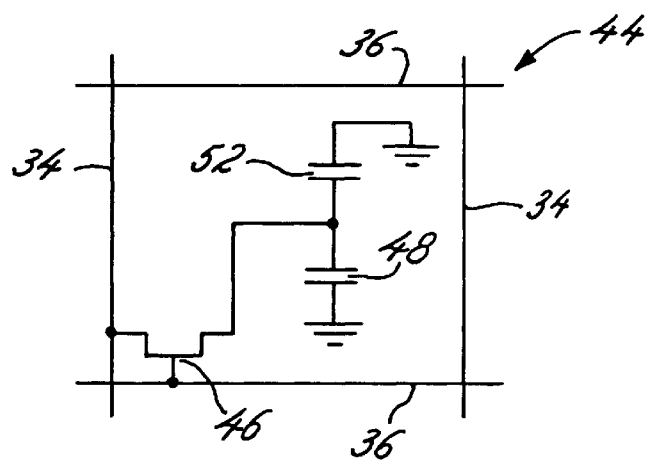
FIG. 3 is a schematic diagram of one pixel of the wafer based active matrix of FIG. 2.

Referring to FIG. 3, a pixel 44 of the wafer based active matrix 30 is illustrated schematically. Generally, a pixel or picture element, is formed of a size approximating the space between an intersecting set of bit lines 34 and word lines 36. The pixel 44 can be formed between the lines or, as will be discussed hereafter, can be formed over the intersections of the bit and word lines 34, 36. In any event, a transistor 46 of a conventional structure, preferably NMOS, CMOS or PMOS, is coupled to each pair of intersecting bit and word lines 34, 36 to activate or deactivate the pixel 44.

Figure 4:
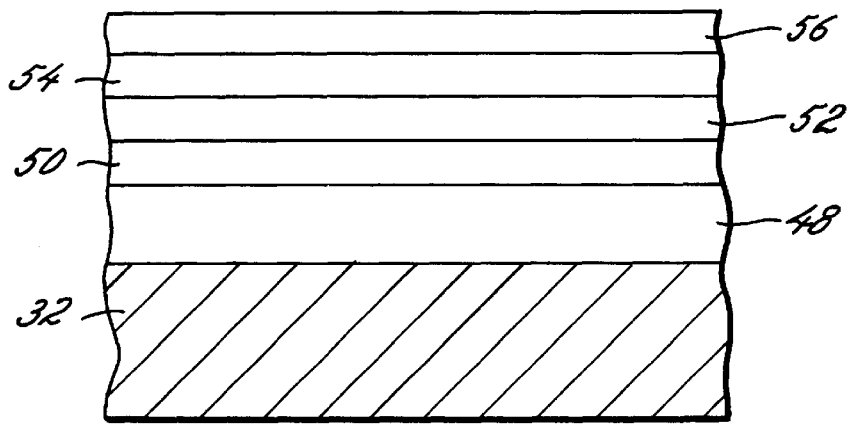
FIG. 4 is a partial cross section of one pixel embodiment of the wafer based active matrix of FIG. 2.

A cross section, not to scale, of one embodiment of the pixel 44 is illustrated in FIG. 4. The pixel 44 is formed on the substrate segment 32 and includes a capacitor structure 48 formed onto the segment 32. A specular aluminum alloy layer or back reflector 50 is formed on the capacitor 48. The specular alloy layer 50 acts as a mirror to reflect light from the wafer based active matrix 30. An LCD or similar characteristic material 52, such as an electrophoretic material is formed onto the reflector 50. One preferable LCD material is a solid light modulating material formed of a polymer matrix having bodies of LC material suspended therein. Examples of such LCD materials are described in U.S. Pat. Nos. 4,435,047 and 4,688,900, which are incorporated herein by reference. This polymer dispersed LCD material (hereinafter PDLC) requires higher operating voltages on the order of 12 volts RMS, which is far more suited to crystalline active matrix devices than to polysilicon or amorphous silicon devices. The crystalline devices also have greater current carrying capacity and faster switching speeds.

An activating electrical contact layer 54 is formed on top of the LCD material layer 52. The layer 54 preferably is formed from indium tin oxide (ITO). Although not illustrated, a thin oxide layer could be formed between the layers 52, and 54, if necessary to prevent a DC offset on the layer 52. This would complete the pixel structure 44, with the ITO layer 54 formed directly onto the LCD material layer 52. This should be possible on the solid host PDLC material, but for other types of LCD material, as well as for different processing techniques, a further glass top layer 56 can be utilized on top of the layer 52.

Utilizing the glass layer 56, the ITO layer 54 could be formed thereon and then the two layers 54, 56 placed onto the layer 52. The layer 52 preferably still would be semi-liquid and also could be formed onto the ITO layer 54 on the glass 56 and then all three layers 52, 54 and 56 placed onto the reflective layer 50, where the layer 52 solidifies.

When utilizing the PDLC material 52, the refractive index of the LC material matches the index of the polymer matrix when the pixel 44 is activated. When the indexes are matched, very little light is scattered and most of the light is reflected off the reflector 50 back out of the pixel 44 and hence the wafer based active matrix 30. When a field is not present on the layer 52, the indexes do not match and most of the light is scattered. The light is still reflected or scattered out of the pixel 44 and hence the wafer based active matrix 30, but the light is dispersed resulting in a black or off pixel when projected. Since the scattering is proportional to the field applied to the pixel 44, a gray scale can be obtained by utilizing a range of voltages.

The wafer based active matrix 30 can be a very high speed and dense matrix since it is formed utilizing conventional crystalline technology. Utilizing high speeds, the circuit 38 preferably would be multiplexed, such as into eight segments to decrease the sampling time. The output of the eight segments then can be sent in parallel to the wafer based active matrix 30.

With the increased switching speeds and increased current capacity of the crystalline transistor 46, the pixel 44 can be charged much faster than with amorphous silicon devices. Amorphous silicon devices have a relatively long turn on time and a low current capacity. Since the bit and word lines 34, 36 are relatively long, there is an associated line capacitance. As the frame rate and number of pixel lines increase, there is a shorter and shorter time period in which to charge the capacitor. There can be a requirement of a 10 microsecond turn on and charge time. An amorphous silicon device can take two to five microseconds just to turn on.

A further advantage of utilizing the crystalline active matrix devices is the fact that the PDLC material has a low resistivity relative to other LC materials. Since a charged pixel must have a time constant of about five frame time periods to accurately reproduce good gray scale, the native capacitance or the PDLC material 52 can't be utilized solely by itself, but requires the separate capacitor 48. Typically amorphous active matrix devices utilize a different LCD material, such that the native LC capacitance can be utilized. This is specially true, since it is difficult to deposit a good thin film oxide for utilization as a capacitor. Utilizing crystalline technology, a grown oxide can be formed on the crystalline substrate 32 which is orders of magnitude better than a deposited oxide.

Applicant has developed a wafer based active matrix structure 30, which utilizes a minimum number of metal layers, a variety of capacitor structures and various enhancement features. The preferred structure 30 includes diffused bit lines 34 and deposited polysilicon word lines 36, with aluminum alloy drain pads 50. Utilizing diffused bit lines 34, shorts between the bit and word lines 34, 36 at the crossovers are minimized since a grown field oxide is formed between the lines. Opens in the lines are virtually eliminated, because the diffused bit lines 34 have very high integrity and the polysilicon word lines 36 provide good adherence to the structure and provide good step coverage. Since the bit lines 34 are diffused into the substrate 32, steps over the bit lines 34 are eliminated.

There are a substantially infinite variety of capacitor structures 48, which can be utilized with the wafer based active matrix 30 of the present invention. These structures can be an oxide-dielectric based capacitor structure, a reverse bias junction structure or a combination of the two.

Figure 5A:
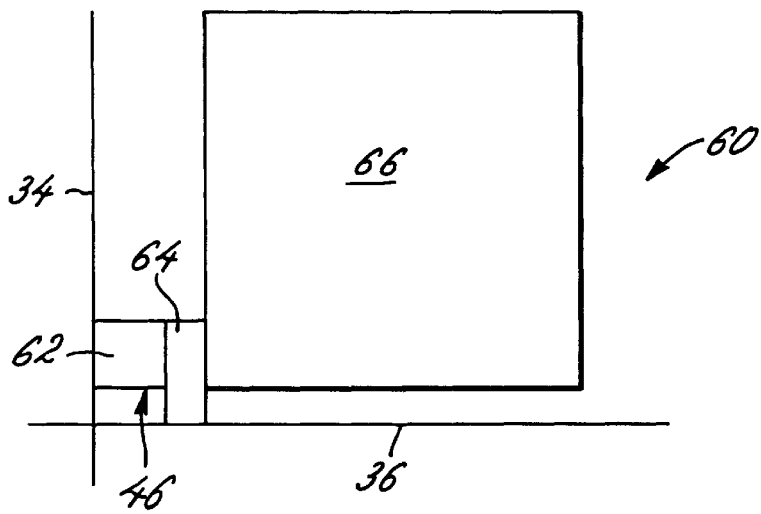
FIGS. 5A & 5B are top and side sectional views of a reverse bias junction capacitor structure of the present invention.
Figure 5B:
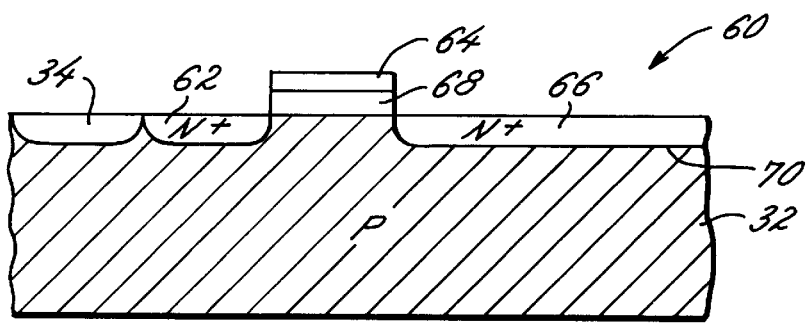

Referring to FIGS. 5A and 5B, a reverse bias junction capacitor structure 60 of the present invention is illustrated. The capacitor 60 includes a source 62, such as an N+ doped region implanted in a P type substrate 32, coupled by a gate 64 to a large implanted N+ doped drain 66. The gate 64 is formed over a gate oxide layer 68, which can be a field oxide (FOX) grown on the substrate 32. The drain 66 forms a reverse bias junction 70 between the N+ drain 66 and the P substrate 32. This reverse bias junction 70 forms a depletion region between the two regions which acts like a capacitor.

Figure 6:
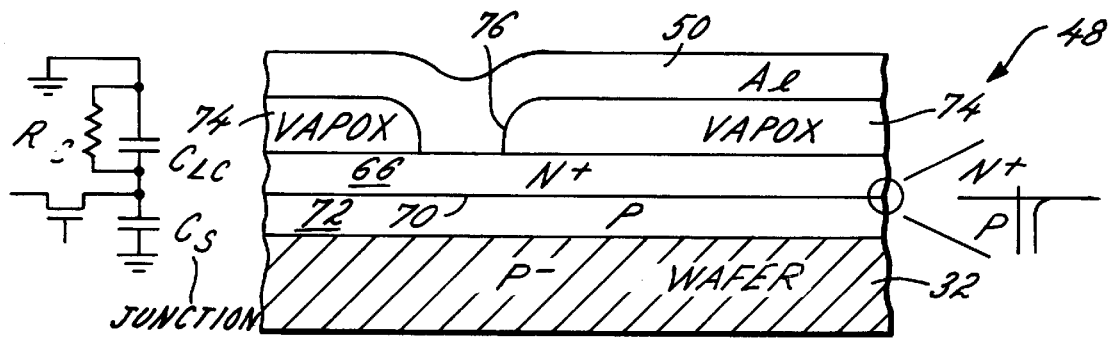
FIG. 6 is a further cross section view of the structure of FIG. 5.

A cross section of one capacitor structure 48 connected to the reflector or electrode 50 is illustrated in FIG. 6. The substrate 32 in this embodiment is a P− doped wafer and thus requires a P layer 72 to be implanted before the N+ layer 66 to provide a sufficient charge difference for the capacitor structure 48. The layer 66 is optionally covered by an oxide layer 74, such as a vapor deposited oxide (VAPOX). The VAPOX layer 74 provides an enhancement to the layer 66, since the odds of a defect in the layer 66 coinciding with a pinhole opening in the VAPOX layer 74 is minimal. A connection between the layer 72 and the reflector 50 would form a short or other leakage path. Further, the reflector 50 is connected to the layer 66 through a via 76 in the layer 74 to provide an electrical connection therebetween. Again, a defect in the layer 66 coinciding with the small via 76 is very unlikely.

The VAPOX layer 74 also can be added for smoothing purposes. The VAPOX layer 74 is deposited and then heated which smooths the upper surface thereof as well as rounding the edges of the layer, for example, the edges of the via 76, for better step coverage of the aluminum layer 50.

Figure 7:
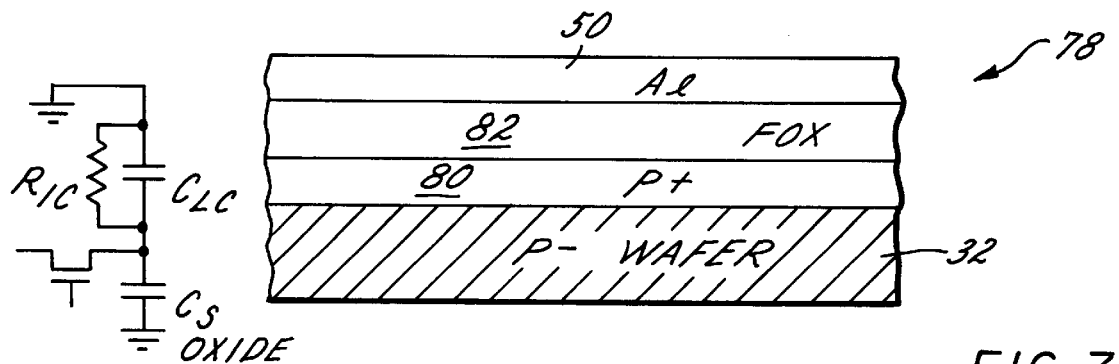
FIG. 7 is a cross sectional view of an oxide capacitor structure of the present invention.

The capacitor structure 48 also can be an oxide-dielectric type capacitor structure 78 as illustrated in FIG. 7. The P− substrate 32 includes a P+ doped layer 80 to minimize the depletion region and maximize storage capacitance with a FOX layer 82 grown thereon. The FOX layer 82 is covered by the reflector 50 with the capacitor 78 being formed by the layers 80, 82 and 50.

Figure 8:
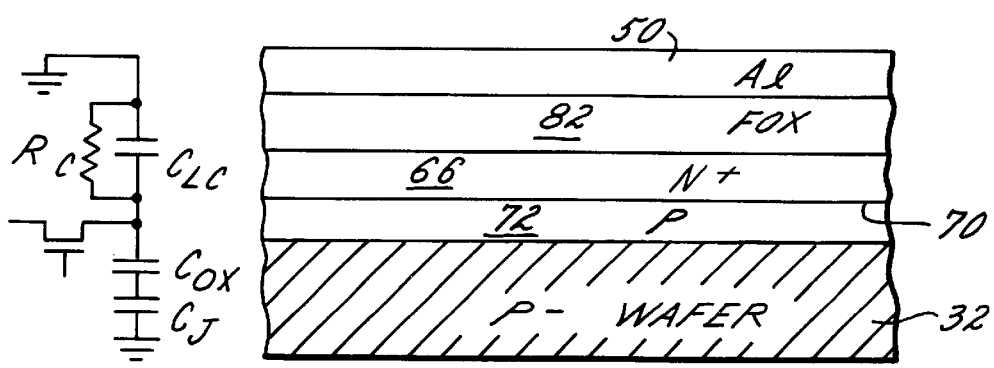
FIG. 8 is a cross sectional view of a combination capacitor structure of the present invention.

If desired, the two capacitor structures can be combined to form a capacitance structure 84 as illustrated in FIG. 8. The combined capacitor structure 84 provides protection from an electrical short in one of the two capacitor structures, which are essentially a combination of the capacitor structures 48 and 78. The two capacitors 48 and 78 are formed in series with the layer 66 being a common plate, such that a short in one capacitor leaves the other operating capacitor so that the pixel is still operational.

Figure 9A:
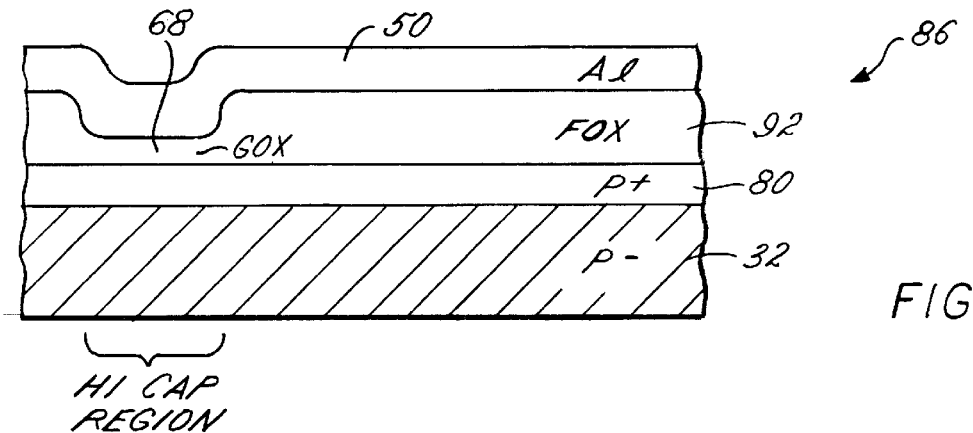
FIGS. 9A, 9B and 9C are cross sectional views of other oxide capacitor structures of the present invention.
Figure 9B:
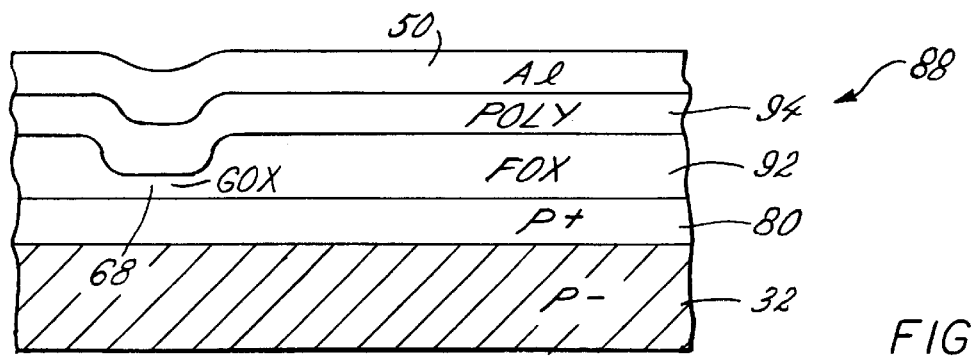
Figure 9C:
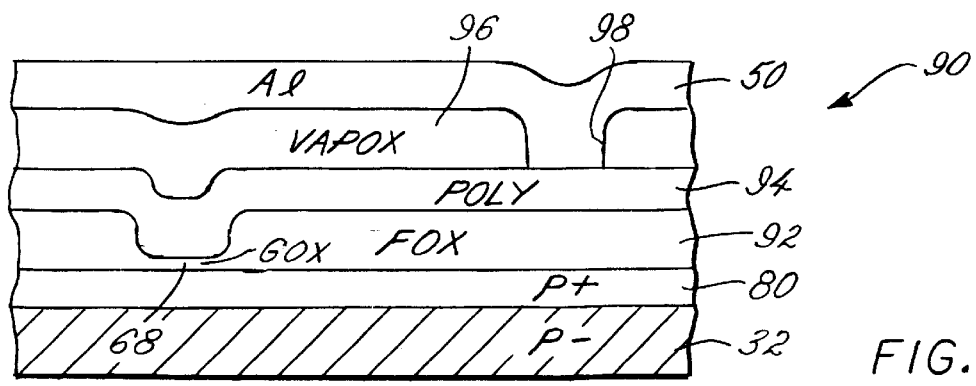

The gate oxide of each pixel also can be utilized as a part of an oxide capacitor structure 86, 88 and 90 as illustrated in FIGS. 9A, 9B and 9C. Each of the structures 86, 88 and 90 form two capacitors in parallel, one formed by the gate oxide area 68 and the second formed over a FOX layer 92 which could be substantially coexistent with the whole pixel area. The capacitor 86 includes only the FOX layer 92, although an additional VAPOX layer (not illustrated) could be added over the FOX layer 92 if desired. The capacitor 88 includes an additional polycrystalline layer 94 formed over the FOX layer 92 as an enhancement to the layer 50. In some instances, the doping process or implanting roughens the surface of the substrate 32. In those types of processes, a further VAPOX layer 96 is formed on top of the poly layer 94 or the FOX layer 92, since the VAPOX layer 96 is very smooth and provides a smooth surface for adherence of the reflective layer 50. The layer 50 is connected to the poly layer 94 through a via 98.

Figure 10A:
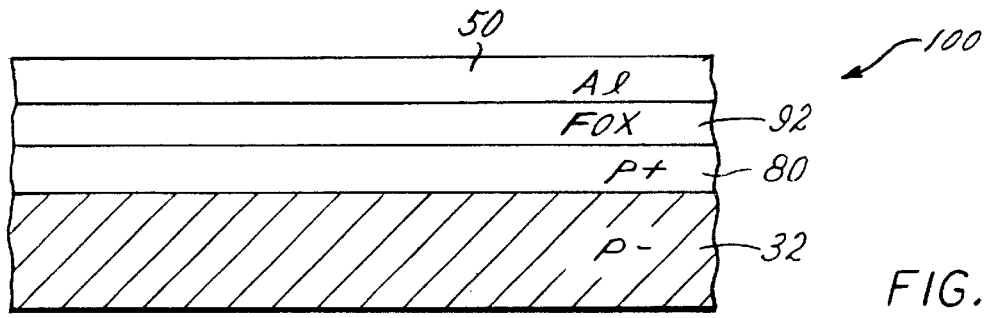
FIGS. 10A, 10B and 10C are cross sectional views of further oxide capacitor structures of the present invention.
Figure 10B:
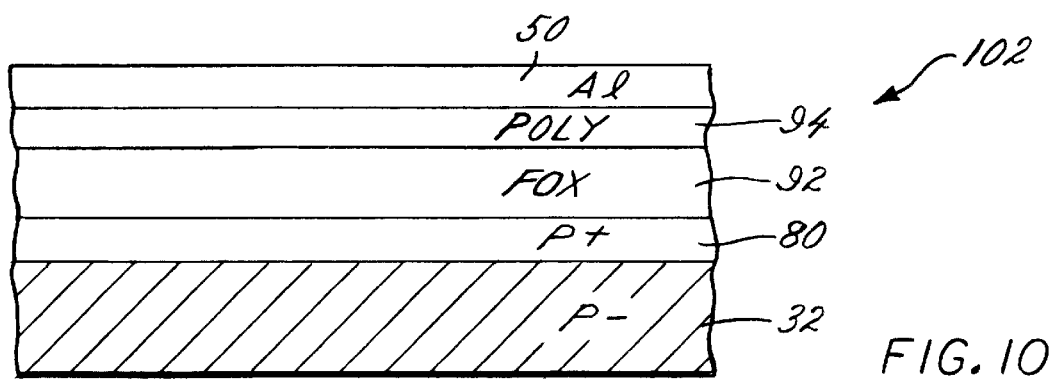
Figure 10C:
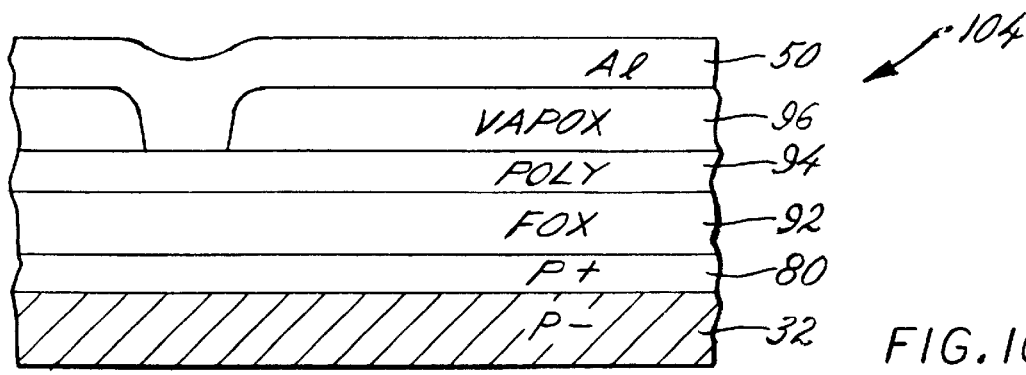

Oxide capacitor structures 100, 102 and 104, which are similar to the capacitor structures 86, 88 and 90 are illustrated in FIGS. 10A, 10B and 10C. The capacitor structures 100, 102 and 104 do not utilize the gate oxides. The capacitor structures 100, 102 and 104 are otherwise essentially the same as the structures 86, 88 and 90. The FOX layer 92 is a further growth of the gate oxide 68, after the gate oxide first is treated as desired and masked to prevent further growth. The tradeoff between the capacitor structures 86, 88 and 90 versus the capacitor structures 100, 102 and 104 is dependent upon the relative size of the gate oxide area 68 versus the rest of the pixel area. As the pixel density is increased, the gate oxide area 68 can become large versus the rest of the pixel area. The tradeoff depends upon which area provides the smallest defect density.

Figure 11:
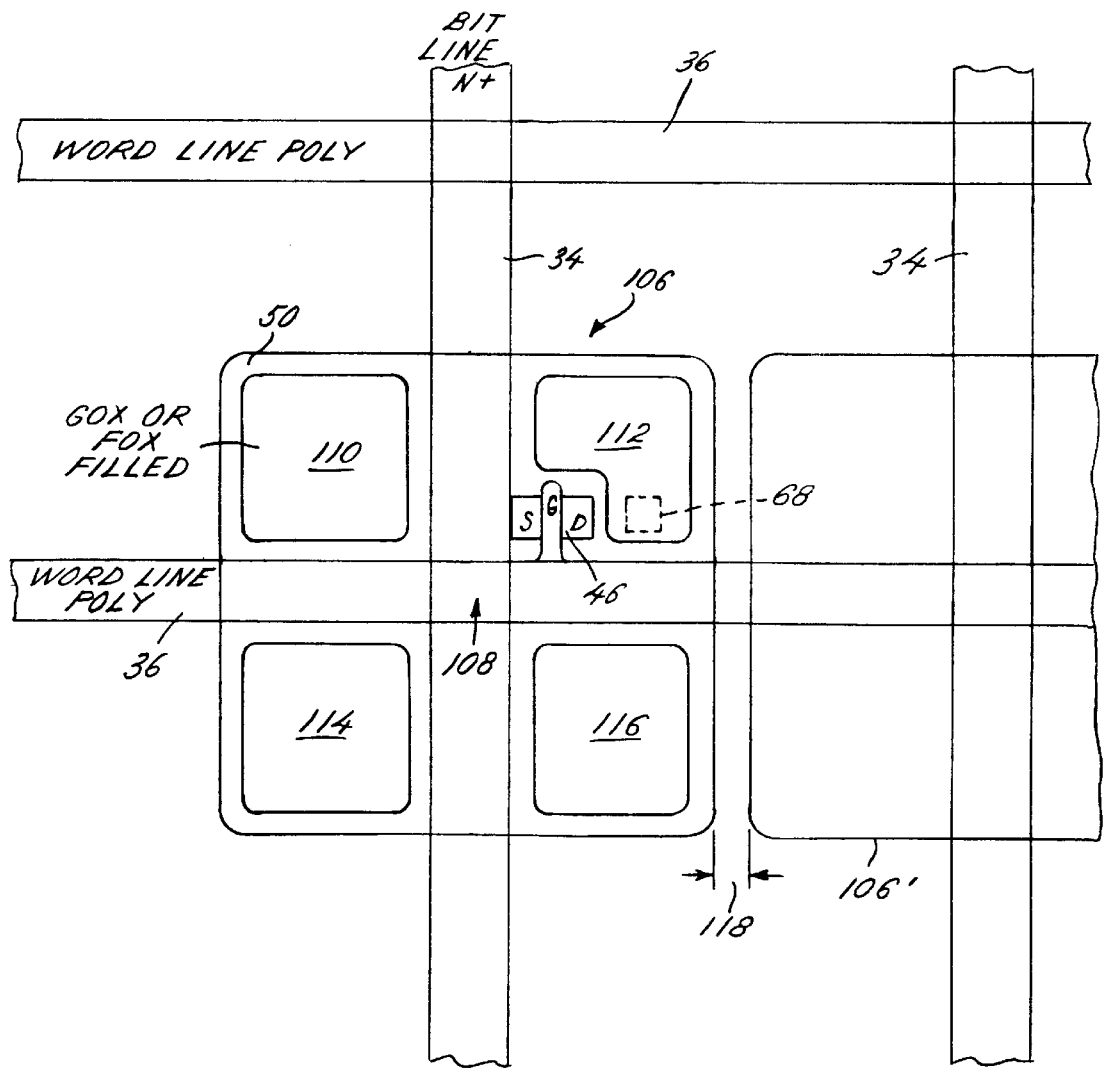
FIG. 11 is a diagram illustrating one pixel embodiment of the present invention.

Referring to FIG. 11, a further pixel embodiment 106 is illustrated, which is formed over an intersection 108 of the bit lines 34 and the word lines 36. In the pixel 106, four capacitors 110, 112, 114 and 116 are formed by depositing the VPPQX layer 96 over the whole structure including the crossover 108 and transistor 46. The VAPOX layer 96 then is removed from the area of the capacitors 110, 112, 114 and 116. The oxide layer can be either the gate oxide 68 or the FOX layer 82 or both, as illustrated in capacitor 112. The VAPOX layer 96 provides protection for the lines 34, 36, crossover 108 and the transistor 46, when the metal layer or pad 50 is deposited over the whole pixel 106. The structure 106 provides a very dense wafer based active matrix since the pixel 106 can be very close to the adjacent pixel 106'. A space 118 is left between the pixels 106 and 106', which is only limited by the minimum feature size of the wafer process and can be much smaller than the width of the lines 34, 36. The electrode pad 50 also forms a light shield for the transistor 46.

Figure 12:
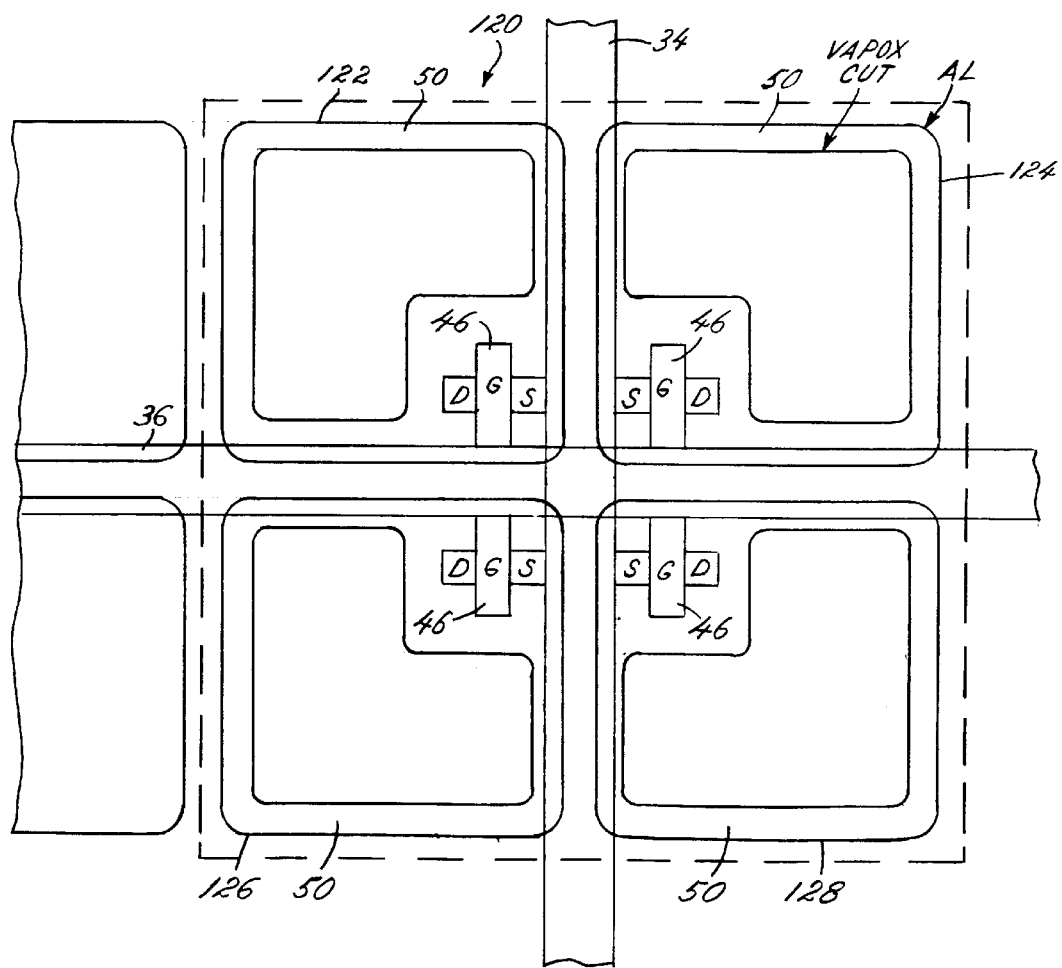
FIG. 12 is a diagram illustrating one subdivided pixel embodiment.

A subdivided pixel embodiment 120 of the present invention is illustrated in FIG. 12. The pixel 120 includes four separate subpixels 122, 124, 126 and 128 each including its own transistor 46 and pad 50. In the pixel 120, if one transistor 46 or one capacitor structure fails, the other three will remain operating. If the size of the subpixels is small enough, the defect will not be visually noticeable, whereas, a defective whole pixel 120 area would be noticeable.

A further enhancement of the wafer based active matrix 30 is the utilization of a fuse protected pixel embodiment 130 as illustrated in FIG. 13. The transistor 46 includes a first fuse 132 coupling the source of the transistor 46 to the bit line 34. A second fuse 134 is formed coupling the gate of the transistor 46 to the word line 36. If a short is developed in the pixel, between the source and the gate or between the gate and the drain of the transistor, or in either of the capacitors 48 or 52, then one or the other of the fuses 132, 134 will blow, disconnecting the transistor 46 and hence the pixel 130 from the wafer based active matrix 30. The fuses 132, 134 preferably are formed by appropriate polysilicon segments connecting the gate and source to the lines 34, 36.

Referring to FIG. 14, a conventional operation of a LCD device 136 is illustrated. The device 136 includes the substrate 32 and a plurality of pixels 44 formed thereon. The device 136 includes a common top electrode or contact 54, such as ITO formed on the glass 56. When the pixels 44 are activated, a plurality of electric field lines 138 are formed through the LC material 52 between the pixels 44 and the common electrode 56 in a conventional manner. The field and hence the lines 138 are formed essentially perpendicular between the pixels 44 and the electrode or plate 56.

When an electric field is applied to LC material, many types of internal molecular and electrooptic property changes can occur. For example, standard twisted neumatic material does not change the polarization of incident light when the electric field is present. When the electric field is not present, the incidental light polarization is rotated, typically 90° or 270°. By utilizing polarizers on both sides of the transmissive LCD device, an image is formed by activating selected ones of the pixels 44. Referring to FIG. 15A, a PDLC material 140 is illustrated schematically between the pixel 44 and the electrode 54. The PDLC material 140, as previously described, includes a solid polymer host matrix 142 in which a plurality of LC material droplets 144 are suspended. The arrows or lines in the droplets 144 are utilized to illustrate that the LC droplets 144 each have an orientation and the orientation of the droplets 144 varies randomly between the droplets 144.

The optical index of refraction of the incident light is different depending upon whether the light strikes the LC droplets 144 at an angle to or parallel to the orientation direction. As illustrated in FIG. 15B, if the refractive index of the LC droplets 144 matches the index of the matrix 142, then light 146 is transmitted through the structure 140 without scattering. If the refractive index of all or most of the LC droplets 144 does not match the matrix 142, then the light 146 is scattered, as illustrated in FIG. 15C. The index of the matrix 142 can be matched to either the normal or perpendicular refractive index of the droplets 144, as illustrated by FIGS. 15D and 15E.

With the randomly oriented droplets 144, the incident light 146 always will be scattered, since a large fraction of the droplets 144 are not properly oriented to match the index of the matrix 142. When the electric field is applied, conventionally perpendicular to the structure as illustrated in FIG. 14, the LC in the droplets 144 reorients to align with the field, such as illustrated in FIG. 15B. Thus, by activating selected pixels 44, images are formed.

As above described, the electrode 54 conventionally has been a sheet of ITO, typically formed on the glass 56 with the LC material 52 between the electrode 54 and the pixels 44. There are several disadvantages to this structure. A separate glass substrate 56 with the ITO layer 54 formed thereon is mounted to the pixel structure, which adds to the construction costs. The ITO layer 54 absorbs and reflects some of the incident light, about 10 to 30 percent, which decreases the device brightness. Additionally, the spacing between the electrode 54 and the pixels 44 must be closely controlled and uniform, which increases the processing precision and hence the cost.

Figure 16A:
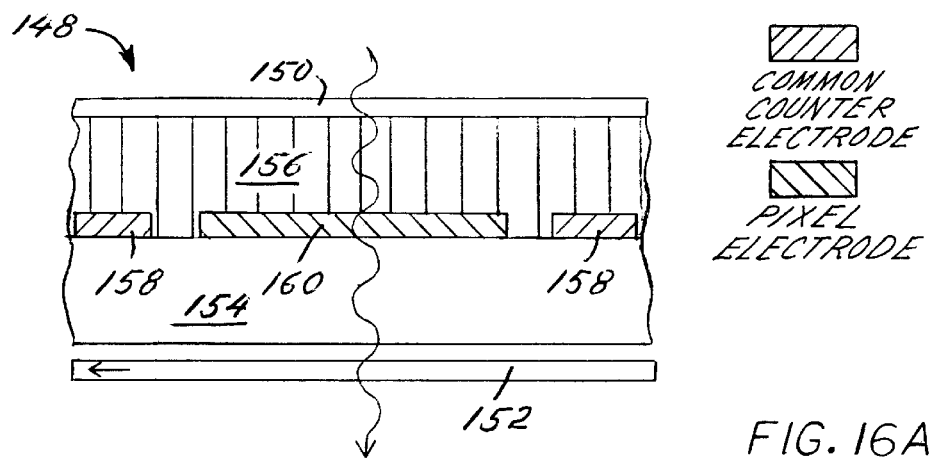
FIGS. 16A and 16B are of cross sectional views of a lateral drive LCD embodiment of the present invention.
Figure 16B:
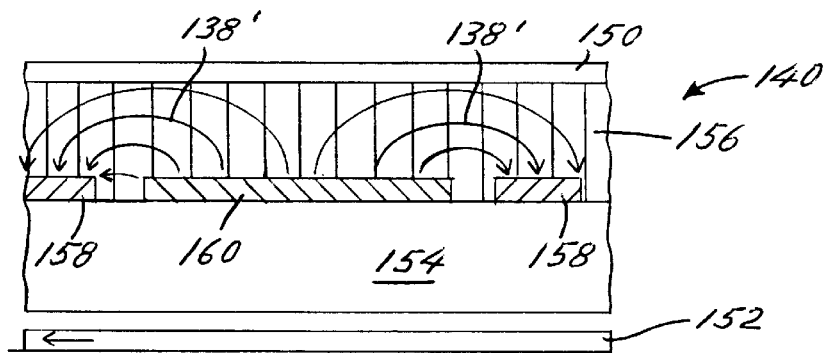

A lateral drive LCD embodiment 148 of the present invention is illustrated in FIGS. 16A and 16B. The LCD device 148 is a transmissive LCD which includes top and bottom polarizers 150 and 152, a drive plane 154, such as amorphous silicon formed on glass and a conventional twisted nematic LC material 156. The LC material 156 is oriented perpendicular to the surface of the LCD device 148 when an electric field is not applied, as illustrated in FIG. 16A.

The LCD 148 includes pixels (pixel electrodes) 158 laterally spaced from a common electrode 160 all formed on the drive plane 154. When the electric field is applied as illustrated in FIG. 16B, the field lines 138' are formed between each of the pixels 158 and the electrode 160. The LC material 156 orientation aligns with the electric field line 138' and the light no longer is rotated and therefore is absorbed in the polarizer 152.

Figure 17A:
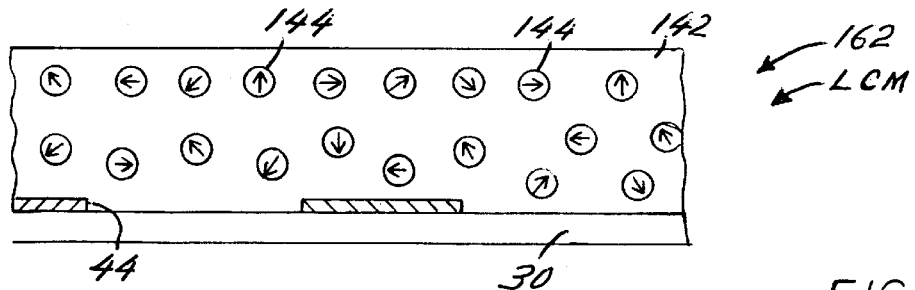
FIGS. 17A and 17B are cross sectional views of a second lateral drive LCD embodiment of the present invention.
Figure 17B:
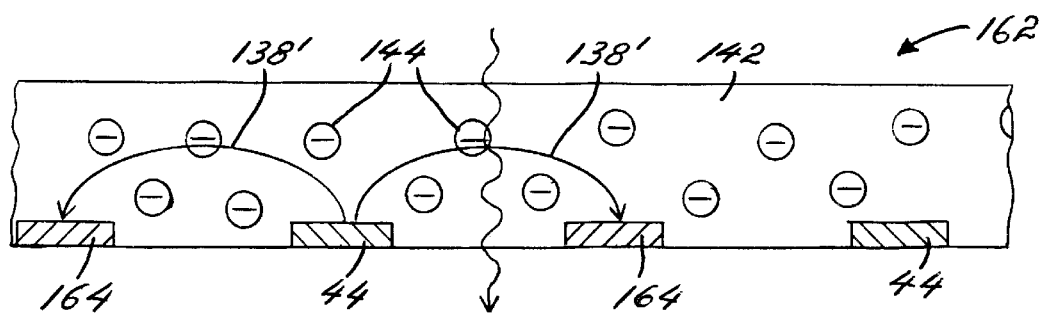

The PDLC material 140 will operate in a similar fashion to the LCD device 148, as illustrated by a LCD device embodiment 162 illustrated in FIGS. 17A and 17B. The wafer based active matrix 30 then would include pixels 44, separated by a common electrode 164. As illustrated in FIG. 17A, the droplets 144 are randomly oriented without the electric field applied and hence the incident light will be scattered. The applied electric field provides the field lines 138', which orient the droplets 144 substantially parallel to the plane of the device 162 to match the index of the matrix 142 and the incident light then will be reflected from each pixel 44 to form an image as desired. For the field lines 138' to be substantially parallel to the plane of the device 162, the space between the pixels 44 and the electrodes 164 should be greater, on the order of twice, that of the thickness of the LC matrix 142. Since the matrix 142 typically will be five to twenty microns thick, the required spacing easily can be achieved.

Figure 18:
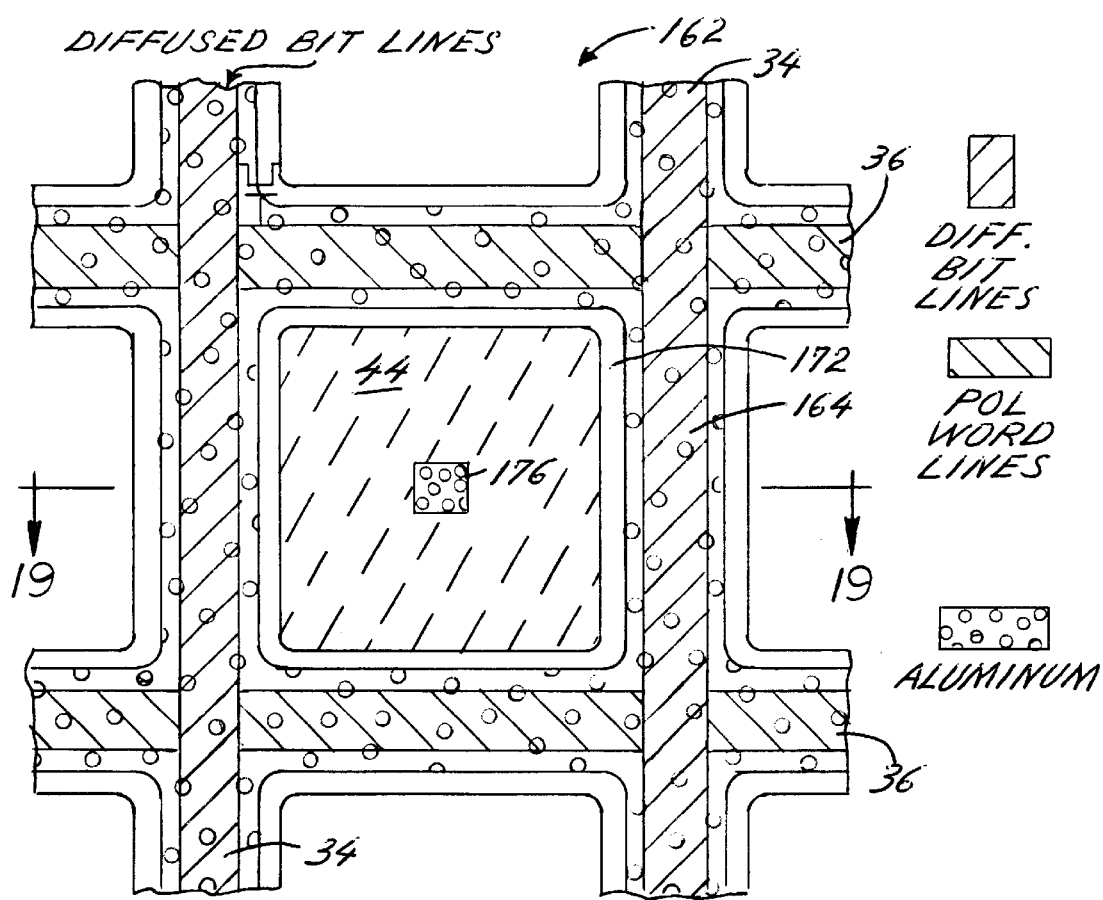
FIG. 18 is a plan view of a lateral drive LCD structure of the present invention.
Figure 19:
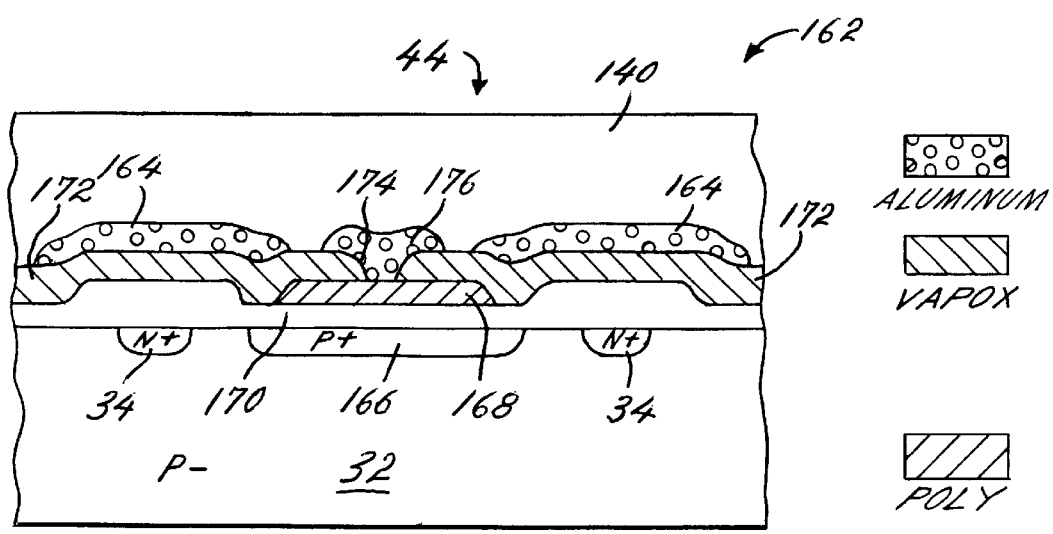
FIG. 19 is a cross sectional view taken along the line 19—19 in FIG. 18.

Referring to FIGS. 18 and 19, one lateral drive implementation of the lateral drive embodiment 162 is illustrated. The pixel 44 includes the bit lines 34, which are N+ diffused regions in the P− substrate 32. A bottom capacitor contact region 166 is formed by a diffused P+ region. A poly layer or plate 168 forms the upper capacitor plate, with an oxide layer 170, FOX and/or gate oxide, separating the plates 166 and 170 to form the dielectric oxide structure. A VAPOX layer 172 is formed over the plate 168 and the FOX layer 170.

A cut or via 174 is formed in the center of the pixel 44 and a small aluminum contact region 176 is formed to provide the pixel contact or electrode. The PDLC layer 140 then is formed on top of the structure to complete the device 162. As required, the distance between the pixel electrodes 176 and the common electrode 164 can be made large compared to the thickness of the PDLC layer 140.

Figure 20:
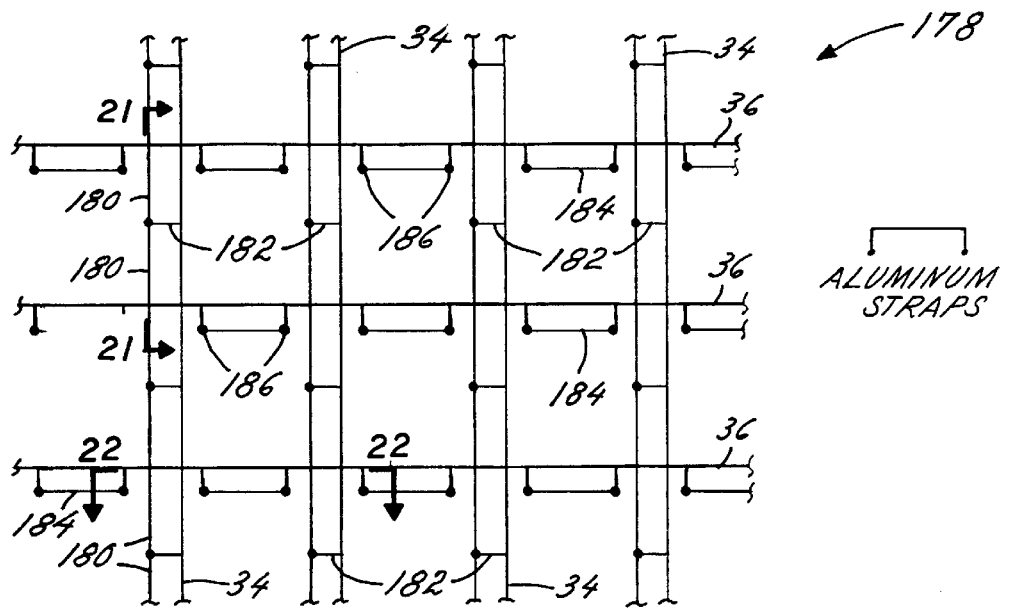
FIG. 20 is a diagrammatic plan view of a bit/word line strapping embodiment of the present invention.
Figure 21:
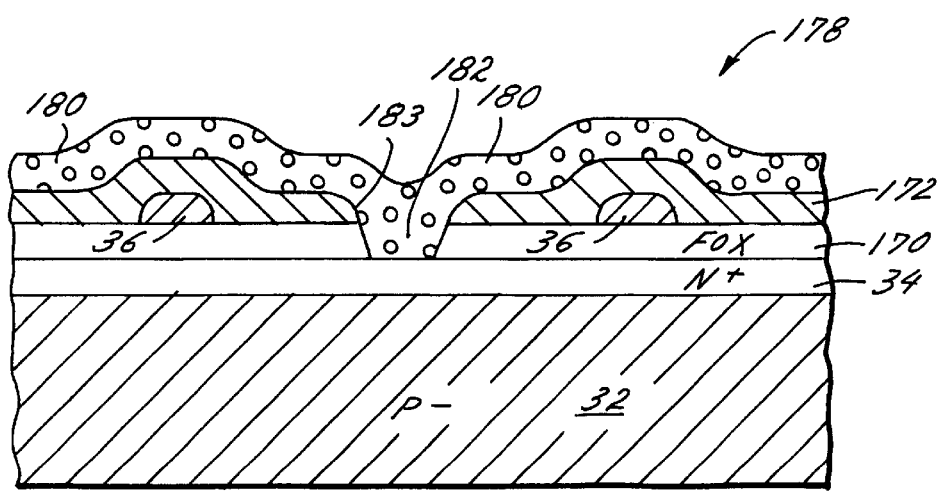
FIG. 21 is a cross sectional view taken along the line 21—21 in FIG. 20.
Figure 22:
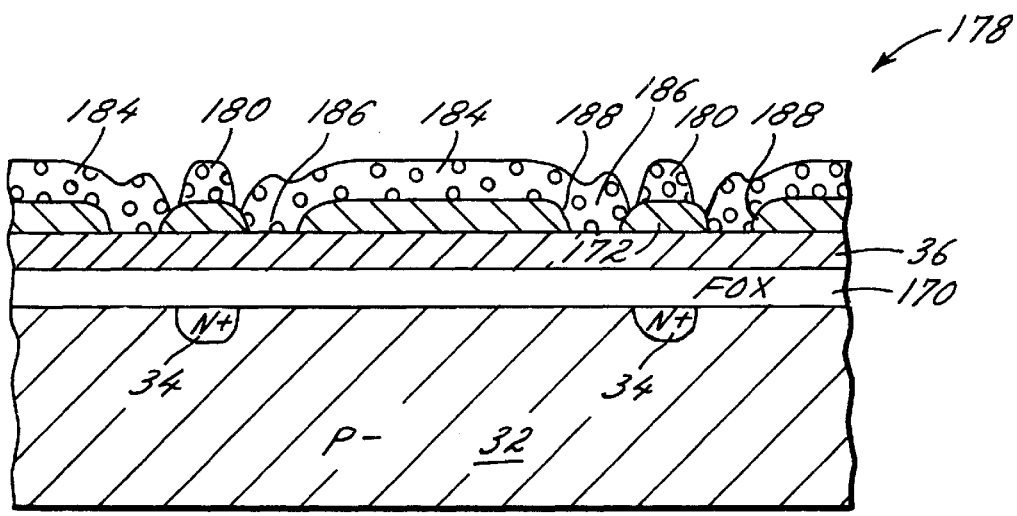
FIG. 22 is a cross sectional view taken along the line 22—22 in FIG. 20.

Referring to FIGS. 20, 21 and 22, a wafer based active matrix line strapping embodiment 178 is illustrated. The strapping structure can be a deposited metal, preferably aluminum or an aluminum alloy, which adds redundancy to the lines 34, 36 while lowering the line resistance. The strapping further ensures that the lines 34, 36 in the wafer based active matrix have electrical continuity without any opens or breaks in the lines 34, 36. In the embodiment 178, the bit lines 34 include a continuous bit strap 180, with electrical connections 182 between the straps 180 and the bit line 34, preferably between each set of word lines 36. The connection 182 is formed by a via 183 cut through the VAPOX layer 172 and the FOX layer 170 to the bit line 34, as illustrated in FIG. 21.

The word lines 36 also can include a word line strap 184, however, the strap 184 is formed in individual segments between each pair of bit lines 34 to form a partially redundant word line strap. Each strap segment 184 is connected at each end 186 to the word line 36 through vias 188 cut through the VAPOX layer 172.

Figure 23:
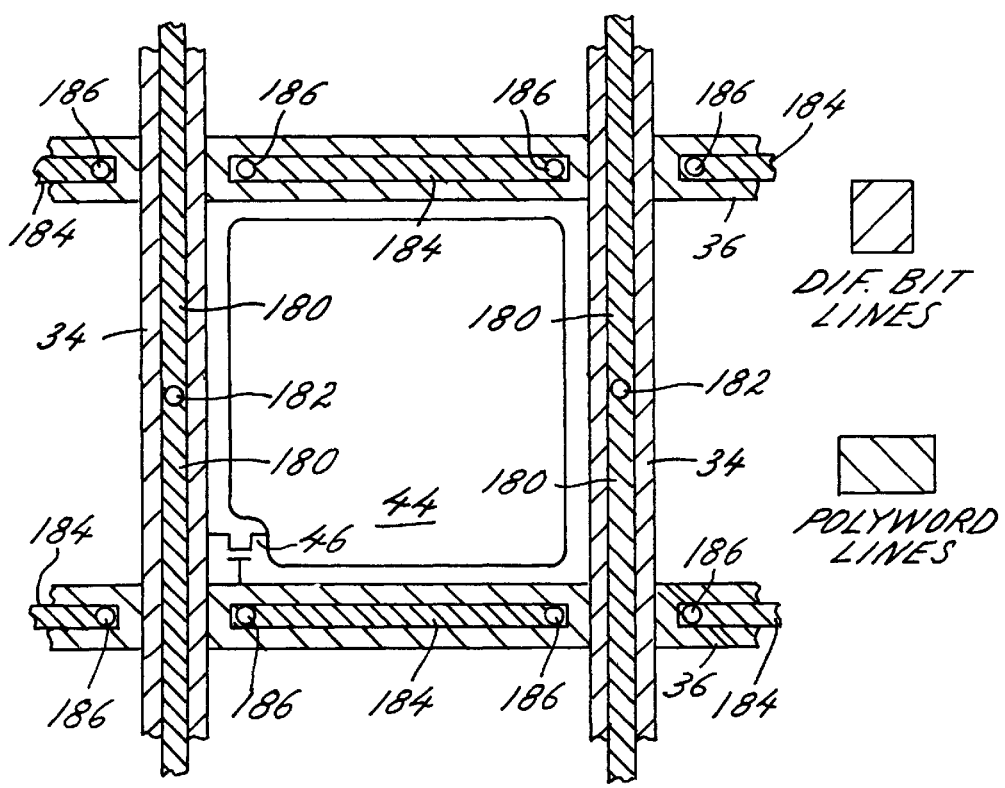
FIG. 23 is a plan view of one bit/word line strapping embodiment structure of the present invention.

Referring to FIG. 23, the structure of the strapping embodiment 178 of the wafer based active matrix is further illustrated. The bit lines 34 have the bit line strap 180 formed thereover, with the connections 182 to lines 34 preferably formed between each pair of word lines 36. Thus, if an open is present anywhere in the line 34, the straps or jumper 180 will provide a current path insuring an operable bit line 34.

In a like manner, the word line strap segments 184 are provided between each pair of bit lines 34. The connections 186 to the word lines 36 at each end of the segments 184 provide a jumper for any opens in between the two connections. The segments 186 cover the major portion of the word line 36, since the probability of an open occurring in the non-strapped portion adjacent each bit line 34 is relatively low.

Figure 24A:
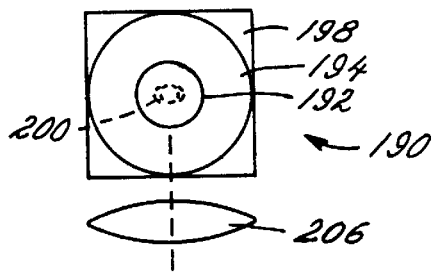
FIGS. 24A, 24B and 24C are diagrammatic top, front and side views of one reflective image plane module embodiment utilizing the wafer based active matrix of the present invention.
Figure 24B:
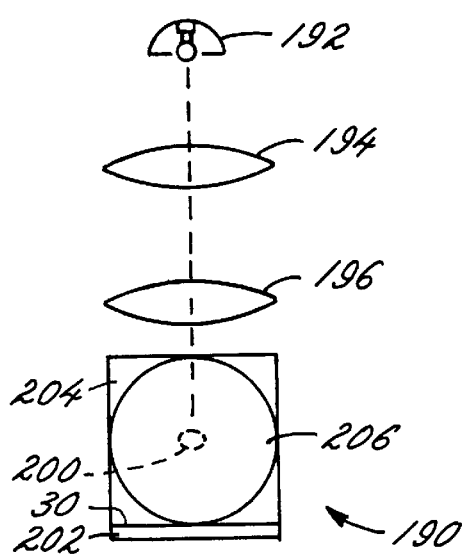
Figure 24C:
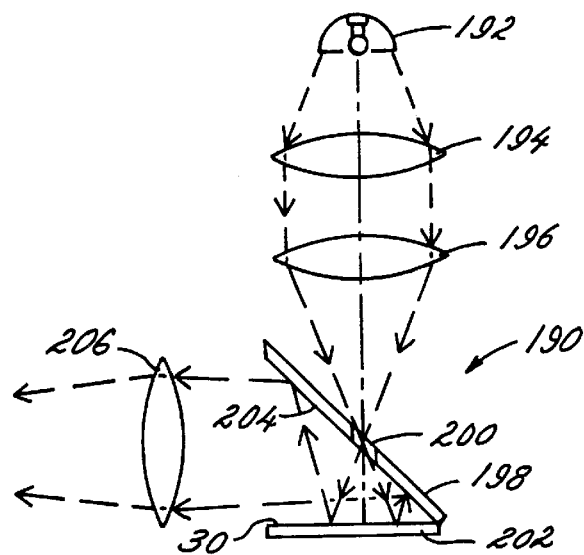

Referring to FIGS. 24A, 24B and 24C, top, front and side views of a first embodiment of a reflective image plane module utilizing the wafer based active matrix of the present invention is designated generally by the reference character 190. A light source 192 such as a bulb and a reflector, provides a source of light. The light is columnated by a lens 194 and condensed or focused by a lens 196 to the reflective image plane module 190.

The reflective image plane module 190 includes a first mirrored wall 198 which has an aperture 200 through which the light passes and impinges on a back wall 202 of the reflective image plane module 190. The back wall 202 has attached thereto or is formed from one of the embodiments of the wafer based active matrix 30. The light has the information imparted to or encoded on it by the wafer based active matrix 30 as it is reflected from the wafer based active matrix as previously described. One specific example of the reflective image plane module is further described in U.S. Ser. No. 392,747, now U.S. Pat. No. 5,024,524 entitled "REFLECTIVE IMAGE PLANE MODULE", filed concurrently herewith and incorporated herein by reference.

The light reflected from the wafer based active matrix 30 is reflected by a mirror back surface 204 of the wall 202. The reflected light is directed to a projection lens 206, which lens or lens system can be a fixed or zoom type lens. If utilized in a projector system, the reflected light is projected by the lens 206 to be viewed, typically on a screen (not illustrated). The wafer based active matrix 30 and the reflective image plane module 190 as described can be utilized as a monochrome projection system or can be combined as will be described hereinafter to form a unit of a full color projection system. If utilized as a mask or portion of a mask system, the lens 106 will be utilized to focus the mask image onto a substrate (not illustrated).

The reflective image plane module 190 generally only includes the light directing and reflecting structures formed by the elements 198, 200, 202 (including the wafer based active matrix 30) and 204. The reflective image plane module 190 can, however, include the light 192 and other light directing elements 194, 196 and 206, if desired. In general, the elements 192, 194, 196 and 206 would be selected by the end utilization of the wafer based active matrix 30 and the reflective image plane module 192.

Figure 25A:
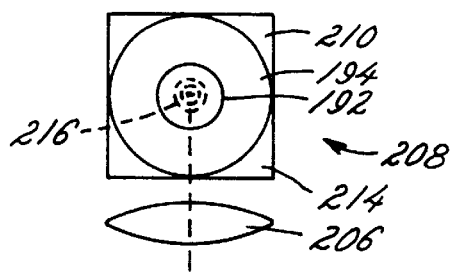
FIGS. 25A, 25B and 25C are diagrammatic top, front, and side views of a second reflective image plane module embodiment utilizing the wafer based active matrix of the present invention.
Figure 25B:
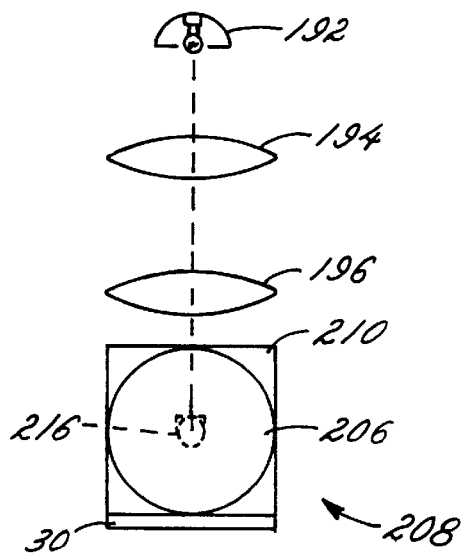
Figure 25C:
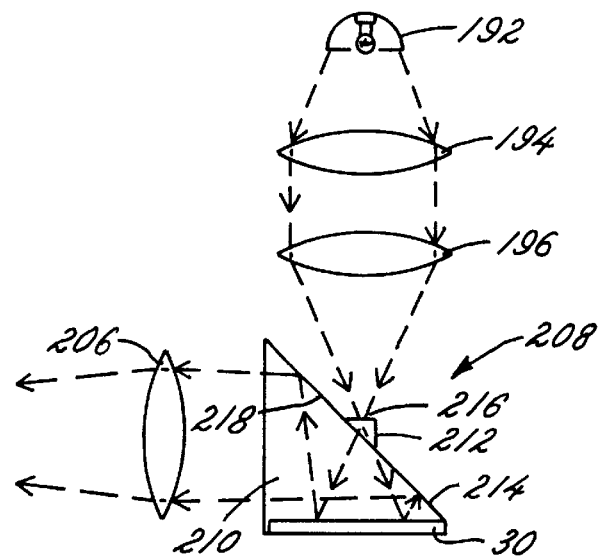

A second embodiment of a reflective image plane module utilizing the wafer based active matrix 30 of the present invention is best illustrated in FIGS. 25A–25C, designated generally by the reference character 208. The same or equivalent elements in this or succeeding embodiments will utilize the same numerals as previously described with respect to the reflective image plane module 190. The reflective image plane module 208 functions substantially the same as the reflective image plane module 190, as illustrated in FIG. 25C. The reflective image plane module 208 replaces the mirror 204 with a prism 210. The prism 210 includes a projection 212 formed in a first wall 214 thereof.

The projection 212 includes a light receiving surface 216, through which the light is focused. As before, the light is acted upon and reflected by the wafer based active matrix 30 and again reflected by an inside surface 218 of the wall 214 to the lens 206. The projection 212 and the surface 216 form another optical element of the reflective image plane module 208.

Further details of the various types of reflector image plane modules and light directing structures, which can incorporate the wafer based active matrix 30 of the present invention are disclosed in the reflective image plane module incorporated herein by reference.

Figure 26:
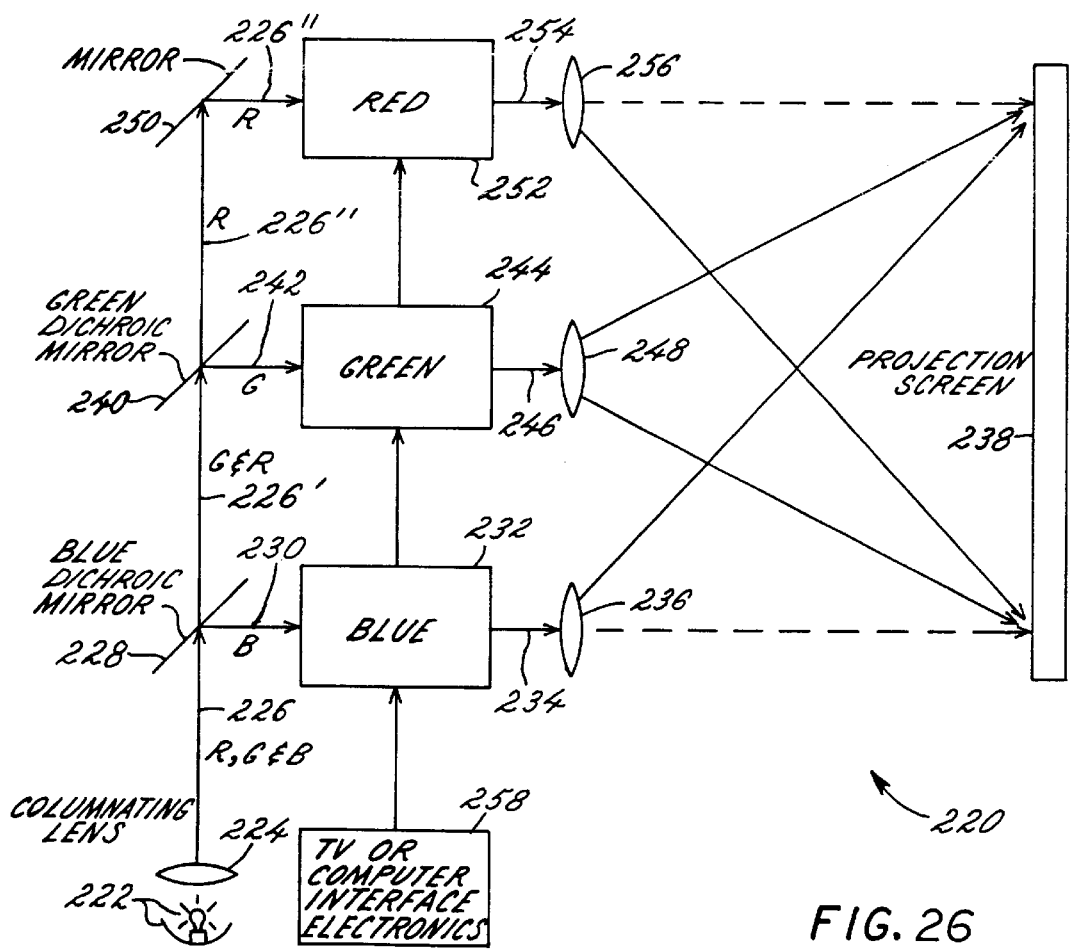
FIG. 26 is a diagrammatic side view of one projection system embodiment utilizing the wafer based active matrix of the present invention.

Each of the above wafer based active matrices 30 and reflective image plane modules can be utilized as part of a monochrome projection or imaging system or can form one reflective image plane module of a three lens color projection system embodiment incorporating the wafer based active matrix of the present invention, for example, as illustrated in FIG. 26 and which is designated generally by the reference character 220. The projection system 220 and other projection systems are further described in U.S. Ser. No. 392,746, now U.S. Pat. No. 5,022,750 entitled "AN ACTIVE MATRIX REFLECTIVE PROJECTION SYSTEM", filed concurrently herewith and incorporated herein by reference. The projection system 220 includes a light source 222, such as a bulb and reflector, from which light is directed through a columnating lens or lens system 224 to form a beam of light 226. The light beam 226 includes all three light components red, blue and green (hereinafter R, B and G).

The beam 226 is directed to a B dichroic mirror 228. A B light component 230 is reflected from the mirror 228 to a B reflective image plane module 232. The B and other reflective image plane modules can be any of the above-described wafer based active matrix 30 and reflective image plane modules such as module 190. Encoded B light 234 is reflected from the B reflective image plane module 232 to a lens 236 and projected by the lens 236 to a screen 238, where it is combined with the other components to form a color image.

A light beam 226' passes through the mirror 228 with the G & R light components therein. The light beam 226' is directed to a G dichroic mirror 240. A G light component 242 is reflected from the mirror 240 to a G reflective image plane module 244. Encoded G light 246 is reflected from the G reflective image plane module 244 to a lens 248 and projected by the lens 248 to the screen 238.

A light beam 226" passes through the mirror 240 with only the R component therein. The beam 226" is directed to a mirror 250 and reflected therefrom to a R reflective image plane module 252. Encoded R light 254 is reflected from the R reflective image plane module 252 to a lens 256 and projected by the lens 256 to the screen 238. The information encoding is provided by an electronic interface 258 coupled to the reflective image plane modules 232, 244 and 252.

Figure 27:
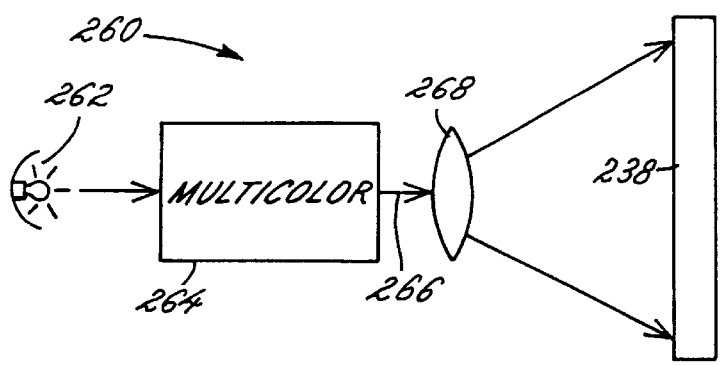
FIG. 27 is a diagrammatic side view of yet another projection system embodiment utilizing a wafer based active matrix of the present invention.

Referring now to FIG. 27 an embodiment of a single imaging, single lens projection system incorporating the wafer based active matrix 30 of the present invention is best illustrated and is designated generally by the reference numeral 260. A light source 262, of any of the above referenced types, provides light to a multicolor reflective image plane module 264. A fully encoded light beam 266 is output from the color reflective image plane module 264 and focused by a lens 268 onto the screen 238. In this configuration, only one reflective image plane module is utilized with one wafer based active matrix; however, the wafer based active matrix 30 includes a mosaic or other type of color filter array integral therewith. This configuration would not currently be the most desirable, because three monochrome wafer based active matrix reflective image plane modules would triple the resolution on the screen 238 and would absorb much less heat than the single reflective image plane module 264.

Modifications and variations of the present invention are possible in light of the above teachings. The pixel electrodes and/or the bit and word lines can be formed from aluminum or an aluminum alloy. The projection system light source could be any suitable type of light source, such as xenon metal halide or quartz-halogen lights for example. It is therefore to be understood that within the scope of the appended claims, the invention may be practiced otherwise than as specifically described.

What is claimed and desired to be secured by Letters Patent of the United States is:

1. A wafer based active matrix, comprising:

a semiconductor wafer;

an active matrix formed on said wafer including a plurality of pixel specular reflective electrodes for forming a reflected light beam from light directed thereto and for imparting information onto said reflected light beam, at least one capacitor formed which each said pixel electrode, said capacitor formed by an oxide layer formed adjacent said pixel electrode and said oxide layer being a grown oxide layer and at least a portion of said layer formed by a transistor gate oxide;

said wafer being a non light transmissive single crystal wafer substrate with said active matrix formed on one surface of said wafer and having at least one portion of said active matrix diffused into said wafer surface;

a liquid crystal type material formed onto said active matrix, said liquid crystal type material including a polymer matrix with a plurality of liquid crystal droplets suspended therein having an orientation which can be activated and oriented by an electric field applied thereto;

a common electrode formed on said polymer matrix for activating the liquid crystal type material over each said pixel as each pixel selectively is activated; and each said pixel electrode coupled to said common electrode, said common electrode formed substantially in a plane with said pixel electrodes and spaced therefrom whereby said wafer based active matrix can be used in a projection display system to display images therewith.

2. A wafer based active matrix, comprising:

a semiconductor wafer segment;

an active matrix formed on said wafer segment including a plurality of pixel specular reflective electrodes, including at least one capacitor formed with each pixel electrode, each pixel electrode coupled to one of a set of matrix bit lines and one of an intersecting set of matrix word lines by a transistor, each said pixel electrode formed over an intersection of the bit and word lines and formed over said transistor, a liquid crystal type of material formed onto said active matrix for forming a reflected light beam from light directed thereto and for imparting information onto said reflected light beam, said capacitor formed by an oxide layer formed adjacent said pixel electrode and said oxide layer being a grown oxide layer and at least a portion of said layer formed by a transistor gate oxide;

said liquid crystal type material including a polymer matrix with a plurality of liquid crystal droplets suspended therein having an orientation which can be activated and oriented by an electric field applied thereto; and said wafer being a non light transmissive single crystal wafer substrate with said active matrix formed on one surface of said wafer and having at least one portion of said active matrix diffused into said wafer surface whereby said wafer based active matrix can be used in a projection display system to display images therewith.

3. The matrix as defined in claim 2 including a common electrode on said polymer matrix for activating the liquid crystal type material over each pixel as each pixel selectively is activated.

4. The matrix as defined in claim 2 wherein said oxide layer is a grown oxide layer and at least a portion of said layer is formed by a transistor gate oxide.

5. The matrix as defined in claim 2 wherein said capacitor is formed by two capacitors in series, a first capacitor formed by a junction between two oppositely doped layers in said wafer segment and a second capacitor formed by an oxide layer formed adjacent said pixel electrode formed on said first capacitor.

6. The matrix as defined in claim 2 wherein said capacitor includes four separate capacitors separated by said intersection.

7. The matrix as defined in claim 4 wherein said electrode is formed in four segments, each coupled by a separate transistor to each of said word and bit lines.

8. The matrix as defined in claim 2 wherein each pixel transistor is coupled to each of said lines by a fuse.

9. The matrix as defined in claim 2 wherein at least a portion of one of said sets of lines includes strapping means for substantially eliminating open circuits in said line portion.

10. The matrix as defined in claim 9 wherein a first one of said sets of lines is formed by diffused lines formed in said substrate segment and said strapping means include a second conductive line formed in parallel to each diffused line, separated by an oxide layer and connected at intervals to said diffused line through said oxide layer.

11. The matrix as defined in claim 10 wherein the other set of lines is formed from deposited lines and said strapping means include a second conductive line formed in segments over said deposited lines, each segment formed and connected to said deposited lines between pairs of the first set of linen.

12. The matrix as defined in claim 2 wherein said active matrix forms a portion of a reflective image plane module.

13. The matrix as defined in claim 2 wherein said reflective image plane module forms at least a portion of a projector system.

14. The matrix as defined in claim 2 wherein said bit lines are formed by diffused lines formed in said substrate segment, said capacitor is formed by a grown oxide layer adjacent said pixel electrode and said word lines are formed from deposited polysilicon lines.

15. A wafer based active matrix, comprising:

a semiconductor wafer segment;

an active matrix formed on said wafer segment including a plurality of pixel specular reflective electrodes and at least one capacitor formed with each pixel electrode, each pixel electrode coupled to one of a set of matrix bit lines and one of an intersecting set of matrix word lines by a transistor, a liquid crystal type material formed onto said active matrix for forming a reflected light beam from light directed thereto and for imparting information onto said reflected light beam, said capacitor formed by an oxide layer formed adjacent said pixel electrode and said oxide layer being a grown oxide layer and at least a portion of said layer formed by a transistor gate oxide;

said liquid crystal type material including a polymer matrix with a plurality of liquid crystal droplets suspended therein having an orientation which can be activated and oriented by an electric field applied thereto;

said wafer being a non light transmissive single crystal wafer substrate with said active matrix formed on one surface of said wafer and having at least one portion of said active matrix diffused into said wafer surface;

a common electrode formed on said polymer matrix for activating the liquid crystal type material over each said pixel as each pixel selectively is activated; and each said pixel electrode coupled to said common electrode, said common electrode formed substantially in a plane with said pixel electrodes and spaced therefrom whereby said wafer based active matrix can be used in a projection display system to display images therewith.

16. A wafer based active matrix, said matrix comprising:

a semiconductor wafer;

an active matrix formed on the wafer, including a plurality of pixel specular reflective electrodes for forming a reflected light beam from light directed thereto, and for imparting information onto said reflected light beam;

a liquid crystal type material formed onto said active matrix, said liquid crystal type material including a polymer matrix with a plurality of liquid crystal droplets suspended therein, having an orientation which can be activated and oriented by an electric field applied thereto;

a common electrode on said polymer matrix for activating the liquid crystal type material over each pixel as each pixel selectively is activated, whereby changes in opacity are caused by varying the orientation of the droplets so as to vary the degree of light scattering through the liquid crystal type material, and whereby said wafer based active matrix can be used in a projection display system to display images therewith;

each pixel electrode is formed over an intersection of a word and bit line;

at least one capacitor is formed with each said pixel electrode, said capacitor formed by an oxide layer formed adjacent said pixel electrode;

said oxide layer being a grown oxide layer;

at least a portion of said layer formed by a transistor gate oxide; and said wafer being a non-light transmissive single crystal wafer substrate with said active matrix formed on one surface of said wafer, and having at least one portion of said active matrix diffused into said wafer surface.

17. The matrix as defined in claim 16 wherein said capacitor is formed by two capacitors in series, a first capacitor formed by a junction between two oppositely doped layers in said wafer and a second capacitor formed by an oxide layer formed adjacent said pixel electrode formed on said first capacitor.

18. The matrix as defined in claim 16 wherein said capacitor includes four separate capacitors separated by said intersection.

19. The matrix as defined in claim 18 wherein said electrode is formed in four segments, each coupled by a separate transistor to each of said word and bit lines.

20. The matrix as defined in claim 16 wherein each pixel includes a transistor coupling said electrode to a word and a bit line, said transistor coupled to each of said lines by a fuse.

21. The matrix as defined in claim 16 wherein each pixel electrode is coupled to one of a set of matrix bit lines and one of an intersecting set of matrix word lines and wherein at least a portion of one of said sets of lines includes strapping means for substantially eliminating open circuits in said line portion.

22. The matrix as defined in claim 21 wherein a first one of said sets of lines is formed by diffused lines formed in said substrate and said strapping means include a second conductive line formed in parallel to each diffused line, separated by an oxide layer and connected at intervals to said diffused line through said oxide layer.

23. The matrix as defined in claim 22 wherein the other set of lines is formed from deposited lines and said strapping means include a second conductive line formed in segments over said deposited lines, each segment formed and connected to said deposited lines between pairs of the first set of lines.

24. The matrix as defined in claim 16 wherein said active matrix forms a portion of a reflective image plane module.

25. The matrix as defined in claim 16 wherein said reflective image plane module forms at least a portion of a projector system.

26. The matrix as defined in claim 11 wherein each pixel electrode is coupled to one of a set of metallic matrix bit lines and one of an intersecting set of metallic matrix word lines.

* * * * *